United States Patent [19]
Yano et al.

[11] Patent Number: 5,537,158
[45] Date of Patent: Jul. 16, 1996

[54] CHANNEL DISPLAY DEVICE FOR RECEIVER USING A TOUCH SENSITIVE OVERLAY

[75] Inventors: Haruto Yano; Yoshiaki Hirasa; Toshimichi Tokunaga, all of Hiroshima; Kazuhiro Yokouchi, Hyogo; Hirofumi Goto, Hyogo; Osamu Shimizu, Hyogo, all of Japan

[73] Assignee: Mitsubishi Denki Kabushiki Kaisha, Tokyo, Japan

[21] Appl. No.: 430,166

[22] Filed: Apr. 27, 1995

Related U.S. Application Data

[63] Continuation of Ser. No. 601,124, Oct. 23, 1990, abandoned.

[30] Foreign Application Priority Data

Oct. 24, 1989 [JP] Japan ................................ 1-277552

[51] Int. Cl.$^6$ .................................................. H04N 5/445
[52] U.S. Cl. ...................... 348/725; 348/732; 348/564; 348/569
[58] Field of Search ........................... 348/725, 729, 348/731, 732, 733, 734, 569, 570, 564, 578, 584, 589, 600, 588; 358/188, 189, 191.1, 192.1, 194.1, 183; 455/157.1, 157.2, 158.2, 158.5, 159.1, 185.1, 186.1, 186.2; 345/173; H04N 5/445, 5/50

[56] References Cited

U.S. PATENT DOCUMENTS

| | | | |
|---|---|---|---|
| 4,542,375 | 9/1985 | Alles | 340/712 |
| 4,644,401 | 2/1987 | Gaskins | 358/22 |
| 4,812,833 | 3/1989 | Shimauchi | 340/712 |
| 4,882,582 | 11/1989 | Oka | 340/712 |
| 4,884,068 | 11/1989 | Matheny | 340/712 |
| 4,897,866 | 1/1990 | Majmudar | 379/94 |
| 4,914,624 | 4/1990 | Dunthorn | 340/712 |
| 4,952,918 | 8/1990 | Fujita | 340/712 |
| 4,959,720 | 9/1990 | Duffield | 358/191.1 |
| 5,157,496 | 10/1992 | Kurosawa | 348/734 |

FOREIGN PATENT DOCUMENTS

| | | |
|---|---|---|
| 2432600 | 7/1974 | Germany . |
| 62-168477 | 7/1987 | Japan . |
| 62-168476 | 7/1987 | Japan . |
| 0294352 | 12/1987 | Japan . |

*Primary Examiner*—Safet Metjahic
*Assistant Examiner*—Sherrie Hsia

[57] ABSTRACT

A channel display device for a receiver which receives television or radio broadcast waves and detects field intensity levels of individual channels to thereby detect receivable stations. A switch pattern for selection of the receivable stations is visually represented on a display screen. A touch switch overlay is provided for outputting a desired-channel switching signal in response to an operator's actuating touch on the switch pattern. Due to such visual representation of the switch pattern and the provision of the touch switch function, switchover to a desired channel can be performed with facility to ensure high operational efficiency.

12 Claims, 5 Drawing Sheets

FIG.5

PRIOR ART

1 [2] 3 [4] 5 [6] 7 [8] 9 [10]
11 [12] 13 14 15 16 17 18 [19] 20
21 22 23 24 25 26 27 28 29 30
⋮
[51] 52 53 54 55 56 57 [58] 59 60
61 62

CHANNEL DISPLAY DEVICE FOR RECEIVER USING A TOUCH SENSITIVE OVERLAY

This application is a continuation of application Ser. No. 07/601,124 filed on Oct. 23, 1990, now abandoned.

BACKGROUND OF THE INVENTION

1. Field of the Invention

The present invention relates to a receiver channel display device which receives television or radio broadcast waves and, after searching receivable stations, displays a switch pattern for actuation of touch switches to select a desired station.

2. Description of the Prior Art

In the conventional receiver channel display devices, there are known some examples as disclosed in Japanese Patent Laid-open Nos. Sho 62 (1987)-168476 and 62 (1987)-168477. Each of such known devices is capable of sequentially selecting stations out of received television broadcast waves, then detecting the field intensity levels of channels relative to the selected stations, subsequently storing receivable stations of high field intensity levels, and visually representing such stations on a display screen instead of a television broadcast picture. FIG. 5 shows an example of such visual representation on a display screen, where numbers corresponding to channels 1 through 62 are displayed, and the channel numbers of receivable stations are enclosed with frames or are displayed in different colors. An operator selects a desired receivable station while watching such display screen, and performs a channel up/down or seek up/down operation by manually actuating a remote control switch for example to consequently execute selective switchover to a desired channel, thereby visually representing a television broadcast picture on the display screen.

Since the conventional receiver channel display device is so constituted as mentioned above, it is necessary for the operator to initially store receivable stations in a memory before a manual operation for selecting a desired station, so that some problems are existent with regard to low operational efficiency and so forth.

SUMMARY OF THE INVENTION

The present invention has been accomplished in an attempt to solve the above-mentioned problems. Its object is to provide an improved receiver channel display device which ensures high operational efficiency in searching stations of receivable broadcast waves and displaying a switch pattern for actuation of touch switches to select a desired station.

For the purpose of achieving the object described above, the channel display device of the present invention is constructed so that a switch pattern for selection of receivable stations in a receiver is visually represented on a display screen, and a touch switch means is provided for outputting a desired-channel switching signal in response to an actuating touch on the display screen.

According to the receiver channel display device of the present invention, a touch switch function is furnished in addition to visual representation of a station selecting switch pattern which is executed after reception of broadcast waves without depending on any positional shift and subsequent search of receivable stations, thereby enabling an operator to perform selective switchover to a desired channel with facility merely by an actuating touch.

The above and other features of the present invention will become apparent from the following description which will be given with reference to the illustrative accompanying drawings.

BRIEF DESCRIPTION OF THE DRAWINGS

FIG. 5 illustrates a visual representation on a display screen in a conventional device.

DESCRIPTION OF THE PREFERRED EMBODIMENT

Below, a preferred embodiment of the present invention will be described with reference to the accompanying drawings.

Figure 1:
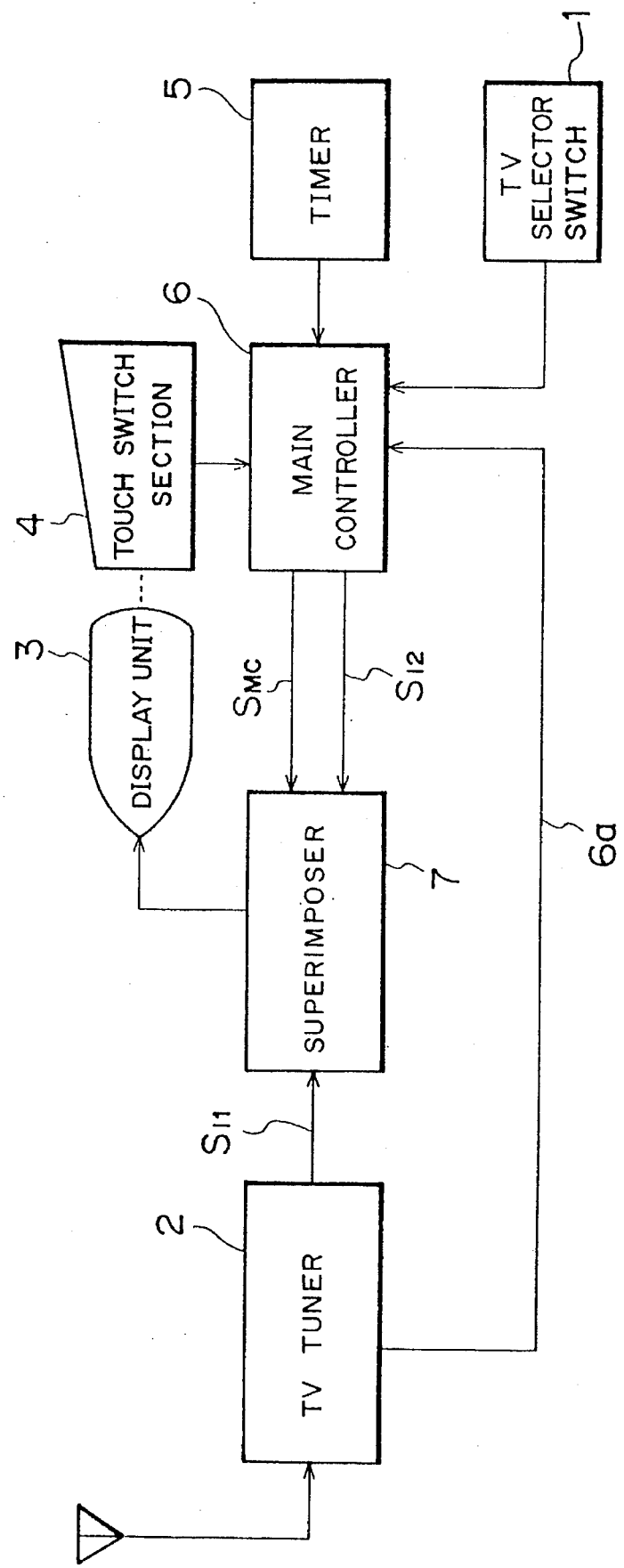
FIG. 1 is a block diagram of an exemplary receiver channel display device embodying the present invention.

FIG. 1 is a block diagram showing the constitution of an exemplary receiver channel display device embodying the present invention. In this diagram, reference numeral 1 denotes a television selector switch for selectively turning on the channel display unit. A television tuner 2 receives television broadcast waves, then converts the received waves into a video signal $S_{f1}$ of a desired channel and outputting the same. In an automatic memory mode, the tuner 2 selects television broadcast waves sequentially, then detects the field intensity levels thereof and produces output signals of channel numbers currently receivable. Also shown are a display unit 3 of CRT (cathode-ray tube) or liquid crystal type for visually representing the video signal on a screen; a touch switch section 4 of a known pressure sensitive type or infrared type where infrared rays are mutually intersecting in a matrix form. The touch switch section 4 is disposed on the screen of the display unit 3, and its touch area is divided into 13 portions for example. When one of such divided partial touch areas is touched, a serial signal corresponding thereto is generated. Further shown are a timer 5 for measuring a predetermined time, and a main controller 6 of a computer constitution for computing and processing, in accordance with a predetermined control program, input digital signals and superimposition display data and so forth stored in a memory incorporated therein. The main controller 6 is connected to all of the television selector switch 1, the touch switch section 4 and the timer 5, and further to the television tuner 2 via a bidirectional communication line 6a. Also shown is a superimposer 7 for superimposing a switch pattern of the touch switch section 4 over the television broadcast picture being visually represented on the display unit 3. The superimposer 7 is connected so as to receive a video signal $S_{f1}$ from the television tuner 2 while receiving a superimposition control signal $S_{MC}$ and a superimpose video signal $S_{f2}$ from the main controller 6.

Figure 2:
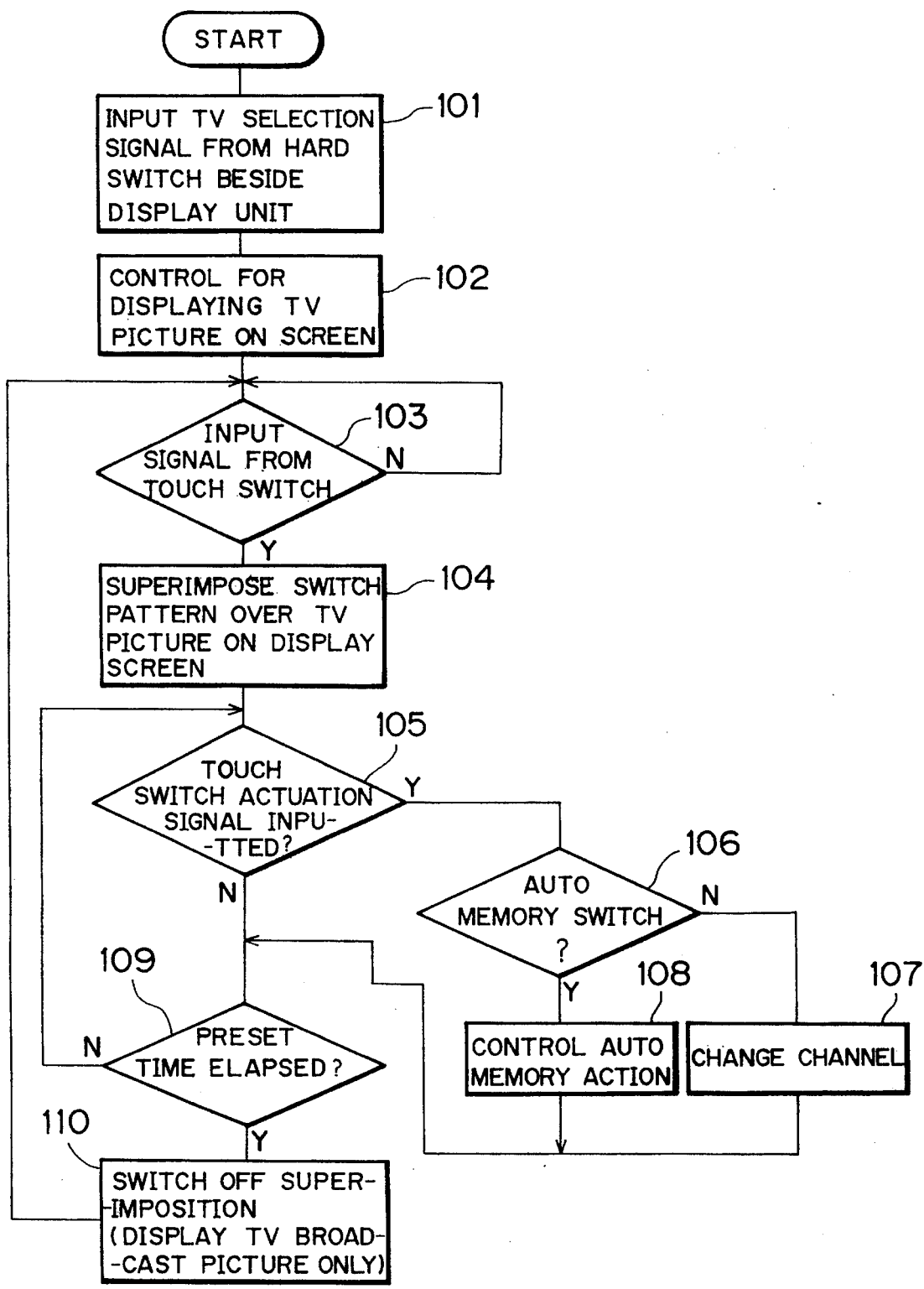
FIGS. 2 and 3 are flow charts each showing the operation of a main controller employed in the embodiment of FIG. 1.

FIG. 2 is a flow chart showing the operation of the main controller 6. Such operating procedure is prepared in the form of a control program and is stored in a memory which is incorporated in the main controller 6.

Figure 3:
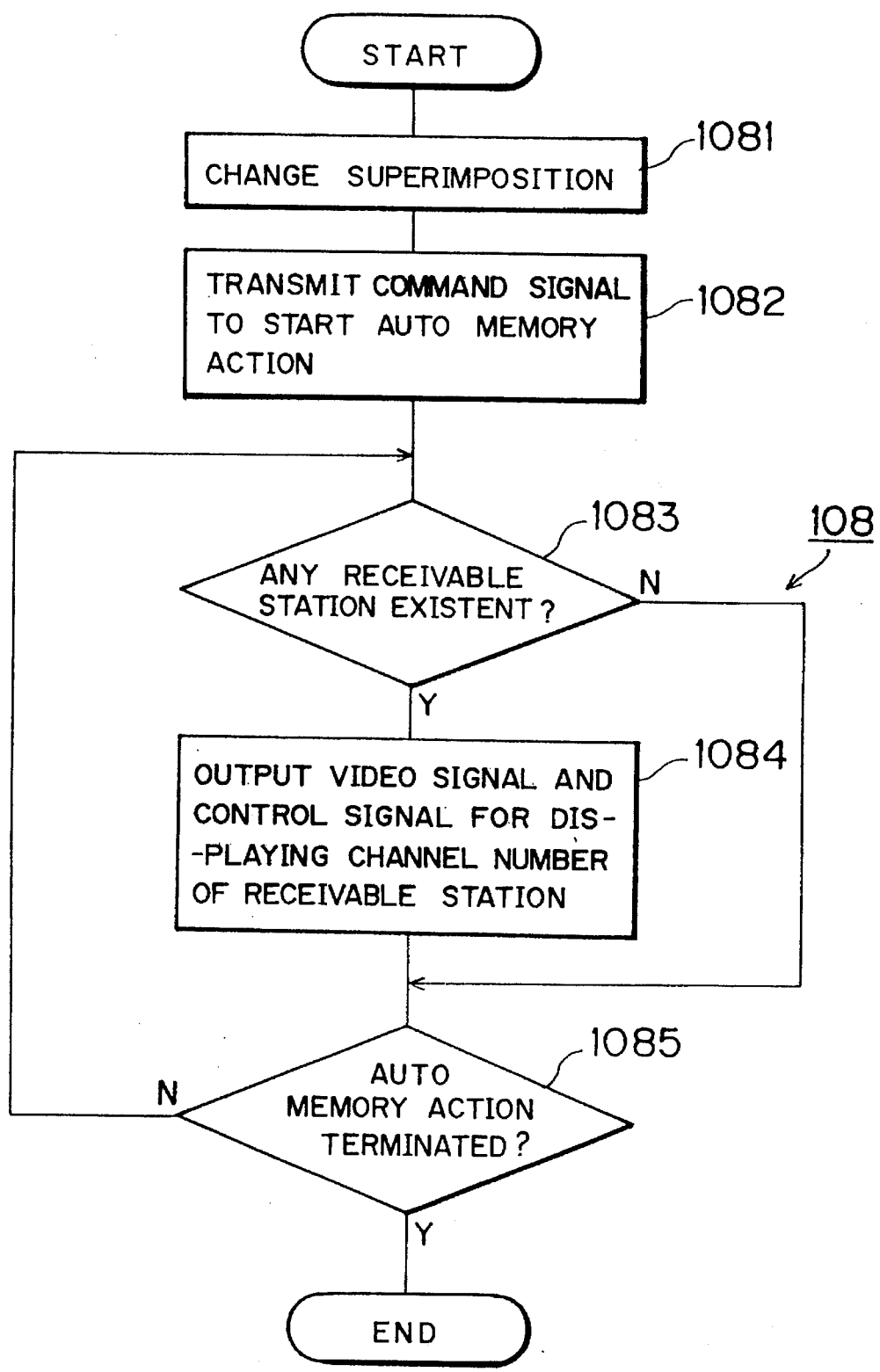

FIG. 3 is another flow chart showing the details of step 108 included in FIG. 2.

FIGS. 4A–4E illustrate changes in the visual representations on the screen of the display unit 3.

Figure 4A:
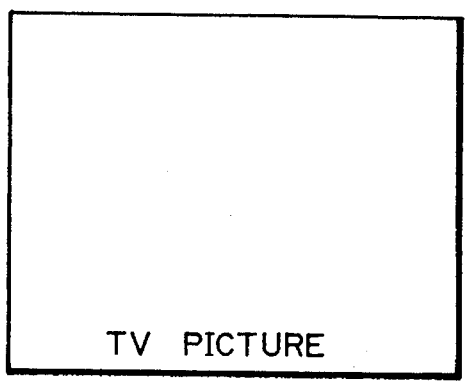
FIGS. 4A–4E illustrate exemplary visual representations on a display screen in the embodiment of FIG. 1.

Now the operation of this embodiment will be described below with reference to FIGS. 1 through 4A–4E. First, when the television selector switch 1 disposed beside the screen of the display unit 3 is actuated by the operator, a television selecting signal from the switch 1 is inputted to the main controller 6 to thereby start the operation (step 101). Subsequently a signal indicative of the preceding desired channel is fed from the main controller 6 via the communication line 6a to the television tuner 2, so that a video signal $S_{f1}$ of the desired channel is generated out of the received television broadcast waves and then is outputted. The video signal $S_{f1}$ is inputted via the superimposer 7 to the display unit 3 and is thereby represented visually as a television picture on the screen, as shown in FIG. 4(A). In this stage, the main controller 6 executes a control action for visually representing merely the television broadcast picture alone on the display unit 3 by outputting a superimposition control signal $S_{MC}$ to the superimposer 7 so as to inhibit superimposition of any other data (step 102). The main controller 6 is held in a standby mode until the touch switch section 4 is actuated and an actuation signal is inputted thereto (step 103). Upon actuation of the touch switch section 4, the main controller 6 outputs to the superimposer 7 a control signal $S_{MC}$ for effecting superimposed display and also a superimpose video signal $S_{f2}$ for the switch pattern relative to the preceding receivable station and so forth (step 104). Then the superimposer 7 suerimposes, over the television broadcast picture represented on the screen of the display unit 3 by the video signal $S_{f1}$, the preceding received channel by the superimpose video signal $S_{f2}$ (e.g. in FIG. 4(B), the channel selector switch pattern of channels 1 to 12) and also the automatic memory switch pattern as shown in FIG. 4(B).

Figure 4D:
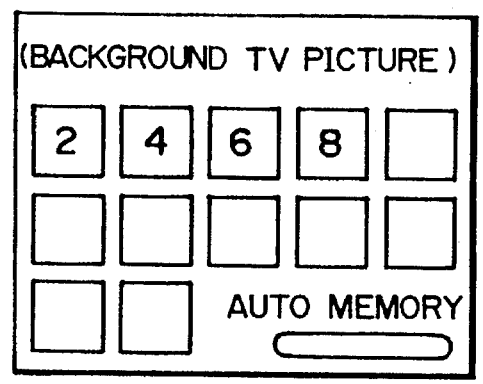
Figure 4B:
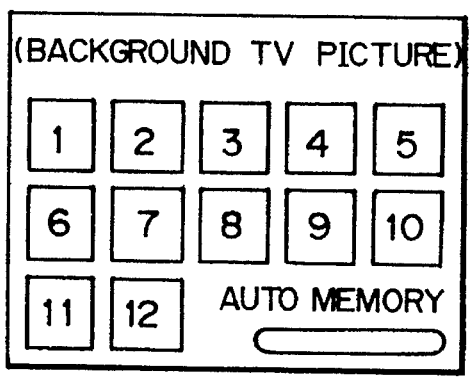

In FIG. 4(B), numerals stand for channel numbers and square frames for areas of the channel selector switches. An oblong frame under the displayed characters "auto memory" stands for an area of the automatic memory switch, and the background is a television broadcast picture of a desired channel.

In the main controller 6, a decision is made as to whether an actuation signal is inputted or not from the touch switch section 4 (step 105). If the result of such decision is affirmative, the process proceeds to step 106. Meanwhile, when the result of the above decision is negative, the process proceeds to step 109. When the result of the decision by the main controller 6 signifies that the touch switch section 4 has been actuated by the operator, a decision is made as to whether such actuation is concerned with the automatic memory switch or not in response to a signal corresponding to the touch position and inputted from the touch switch section 4 (step 106). If the result of the decision by the main controller 6 signifies no actuation of the automatic memory switch, it indicates actuation of the channel selector switch, so that the desired channel is identified from the serial signal obtained from the touch switch section 4, and a channel switching operation is performed (step 107). Due to such channel switching operation, a signal for switchover to the desired channel is transmitted from the main controller 6 via the communication line 6a to the television tuner 2, so that a video signal $S_{f1}$ corresponding to the desired channel is produced by the television tuner 2 out of the received television broadcast waves and then is outputted therefrom. In this manner, a television broadcast picture of the desired channel is selected and visually represented on the screen of the display unit 3.

Meanwhile, if the result of the decision in step 104 signifies actuation of the automatic memory switch, the process of the main controller 6 proceeds to step 108 for control of the automatic memory action.

Figure 4E:
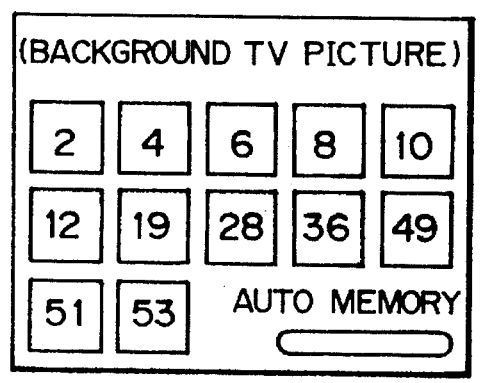
Figure 4C:
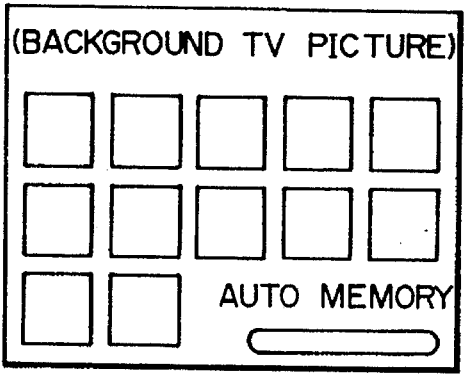

Referring now to the flow chart of FIG. 3 principally, a description will be given with regard to the automatic memory action. The main controller 6 changes the superimpose video signal $S_{f2}$ and erases the channel numbers as shown in FIG. 4(C) for changing the channel selector switches, thereby altering the superimposed display (step 1081). Subsequently a command signal for starting the automatic memory action is outputted from the main controller 6 via the communication line 6a to the television tuner 2 (step 1082). In response to such command signal, the television tuner 2 automatically selects the received television broadcast waves in sequence from channel 1 to channel 62, for example, then compares the field intensity level of each channel with a reference level and searches receivable stations. During such operation, if there is detected any receivable station, the television tuner 2 converts the relevant channel number into a signal and transmits such signal via the communication line 6a to the main controller 6. Subsequently the main controller 6 makes a decision as to whether any receivable station is existent or not in accordance with the presence or absence of such input signal (step 1083). If any receivable station is existent, the superimpose video signal $S_{f2}$ is changed and outputted for visually representing the relevant channel number in a vacant frame of the channel selector switch on the screen of the display unit 3 (step 1084). Upon determining the non-existence of any receivable station in step 1083 or after the process in step 1084, the main controller 6 makes a decision in step 1085 as to whether the automatic memory action is terminated or not. And if the result of such decision is negative, the process is returned to step 1083 and the foregoing operation is repeated. When the result of the above decision is affirmative, the process in step 108 is terminated. The discrimination between such termination and non-termination depends on the presence or absence of an end signal inputted from the television tuner 2 to the main controller 6. FIG. 4(D) illustrates an exemplary visual representation on the screen of the display unit 3 during the automatic memory action, where channels 2, 4, 6, 8 of receivable stations are superimposed as a channel selector switch pattern. In another example of FIG. 4(E) illustrating a visual representation on the screen of the display unit 3 after termination of the automatic memory action, 12 receivable stations are superimposed as a channel selector switch pattern.

After completion of step 107 or 108 in the main controller 6, the process proceeds to step 109. In response to the signal obtained from the timer 5, the main controller 6 makes a decision in step 109 as to whether a preset time has elapsed or not posterior to input of the actuation signal in step 103. If the result of such decision is negative to indicate no lapse of the preset time, the process is returned to step 105 and the foregoing operation is repeated. In this stage, if a desired channel selector switch is actuated at the time of visual representation illustrated in FIG. 4(E) for example, the background (television broadcast picture) on the screen of the display unit 3 is switched over to a television broadcast picture of such desired channel.

When the main controller 6 determines the lapse of the preset time in step 109, the process proceeds to step 110 where a control signal $S_{MC}$ for inhibiting a superimposed visual representation is outputted while a superimpose video signal $S_{f2}$ is not outputted so that, as illustrated in FIG. 4(A), merely a television broadcast picture of the desired channel alone is continuously represented on the screen of the display unit 3.

The embodiment described is concerned with an exemplary case of applying the present invention to television broadcast. It is to be understood, however, that the present invention is not limited thereto alone and may also be applied to radio broadcast as well. In the latter case, a radio tuner having an automatic memory function may be employed in place of the aforementioned television tuner, and an acoustic signal from the radio tuner may be outputted via an amplifier and a loudspeaker. And a switch pattern for selection of receivable stations may be visually represented on the display screen to select radio broadcasting stations by touch switches. In this case, the switch pattern need not be erased after the lapse of a preset time unlike in the above embodiment, so that the timer is no longer necessary, and the superimposer is not required either.

According to the present invention, as described hereinabove, receivable broadcasting stations are first detected, then a switch pattern for selecting receivable stations by a touch switch means is visually represented on a display screen, and switchover to a new desired channel is performed by actuating the touch switch means, whereby selection of any receivable station can be executed with facility to ensure high operational efficiency.

What is claimed is:

1. A channel display device for a television receiver, comprising:

superimposing means for electronically superimposing a switch pattern upon a television signal currently being displayed on a screen of said television receiver; and switch pattern generating means for detecting field intensities of received television channels, for determining which of said received television channels are available channels, said available channels being ones of said received television channels which have strong enough field intensities to be received and displayed on said screen of said television receiver, and for generating said switch pattern, said switch pattern having a plurality of display areas with each available channel being displayed in one of said display areas directly next to at least one other of said display areas displaying one of said available channels.

2. The device of claim 1, wherein said display areas include a matrix of rectangles.

3. The device of claim 1, wherein said switch pattern generating means generates said switch pattern so that said available channels are displayed in said display areas by increasing channel number.

4. The device of claim 1, wherein said switch pattern generating means determines whether a received television channel is an available channel by comparing a field intensity for said received television channel to a predetermined threshold.

5. The device of claim 1, further comprising:

a touch sensitive screen overlay disposed on said screen, said touch sensitive screen overlay outputting a channel-selecting signal corresponding to one of said display areas of said switch pattern when a user touches said one of said display areas.

6. The device of claim 5, wherein said switch pattern generating means generates said switch pattern so that said switch pattern includes a functional area;

said touch sensitive screen overlay outputs a control signal to said switch pattern generating means when the user touches said functional area; and said switch pattern generating means performs said detecting, determining and generating in response to said control signal.

7. A method of displaying channels on a screen of a television receiver, comprising:

a) detecting field intensities of received television channels;

b) determining which of said received television channels are available channels, said available channels being ones of said received television channels which have strong enough field intensities to be received and displayed on said screen of said television receiver, c) generating a switch pattern, said switch pattern having a plurality of display areas with each available channel being displayed in one of said display areas directly next to at least one other of said display areas displaying one of said available channels; and d) electronically superimposing said switch pattern upon a television signal currently being displayed on said screen of said television receiver.

8. The method of claim 7, wherein said step c) generates said switch pattern such that said display areas include a matrix of rectangles.

9. The method of claim 7, wherein said step c) generates said switch pattern such that said available channels are displayed in said display areas by increasing channel number.

10. The method of claim 7, wherein said step b) determines whether a received television channel is an available channel by comparing a field intensity for said received television channel to a predetermined threshold.

11. The method of claim 7, wherein said television receiver includes a touch sensitive screen overlay disposed on said screen, and said method further comprises the step of e) outputting a channel-selecting signal corresponding to one of said display areas of said switch pattern when a user touches said one of said display areas.

12. The method of claim 11, wherein said switch pattern includes a functional area; and said steps a), b), and c) are performed if the user touches said functional area.

* * * * *